United States Patent
Yamada et al.

(10) Patent No.: US 7,573,279 B2
(45) Date of Patent: Aug. 11, 2009

(54) JIG FOR KELVIN TEST

(75) Inventors: Tomoyuki Yamada, Gunma (JP); Satoshi Kakegawa, Gunma (JP)

(73) Assignee: Yokowo Co., Ltd., Tokyo (JP)

( * ) Notice: Subject to any disclaimer, the term of this patent is extended or adjusted under 35 U.S.C. 154(b) by 0 days.

(21) Appl. No.: 11/889,580

(22) Filed: Aug. 14, 2007

(65) Prior Publication Data

US 2008/0042676 A1    Feb. 21, 2008

(30) Foreign Application Priority Data

Aug. 15, 2006    (JP) ................... P2006-221531

(51) Int. Cl.
*G01R 31/02*    (2006.01)
(52) U.S. Cl. .................................... 324/755
(58) Field of Classification Search ............ 324/713, 324/715
See application file for complete search history.

(56) References Cited

U.S. PATENT DOCUMENTS

| | | | |
|---|---|---|---|
| 6,218,846 B1 * | 4/2001 | Ludwig et al. | 324/713 |
| 6,411,112 B1 * | 6/2002 | Das et al. | 324/754 |
| 6,743,043 B2 * | 6/2004 | Yamada | 439/482 |
| 7,102,373 B2 * | 9/2006 | Yoshida | 324/755 |
| 7,271,606 B1 * | 9/2007 | Tang et al. | 324/761 |
| 7,298,153 B2 * | 11/2007 | Farris et al. | 324/754 |

FOREIGN PATENT DOCUMENTS

| | | |
|---|---|---|
| JP | 61-48372 U | 4/1986 |
| JP | 3-122370 U | 12/1991 |
| JP | 2005-062100 | 3/2005 |
| JP | 2006-62100 | 3/2005 |

* cited by examiner

*Primary Examiner*—Ha Tran T Nguyen
*Assistant Examiner*—Roberto Velez
(74) *Attorney, Agent, or Firm*—Morgan, Lewis & Bockius LLP

(57) ABSTRACT

A jig for Kelvin Test includes a first probe and a second probe which are arranged in parallel in a socket comprised of insulating material. Probes include a conductive tube and a conductive plunger, contained in at least one end side of the tube, and having a distal end part protruding axially outward from the tube. The tube contains a coil spring adapted to elastically urge the plunger outward. The first probe is used for supplying electric current to a terminal of an electronic component to be tested. The second probe is used for monitoring electric voltage of the terminal. A first cross section of the tube of the first probe which is perpendicular to the axial direction is greater than a second cross section of the tube of the second probe which is perpendicular to the axial direction. The plunger is brought into elastic contact with the terminal.

5 Claims, 6 Drawing Sheets

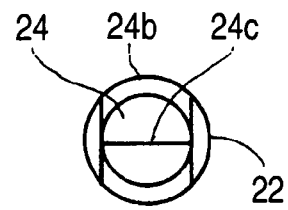
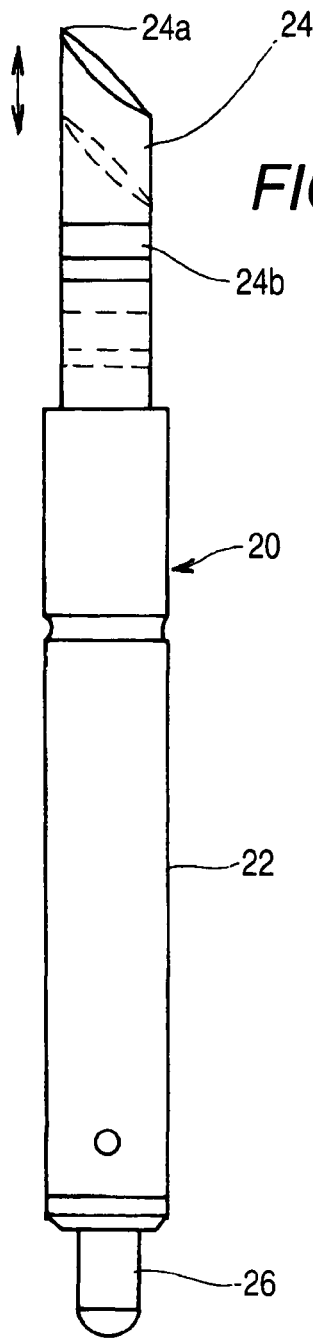
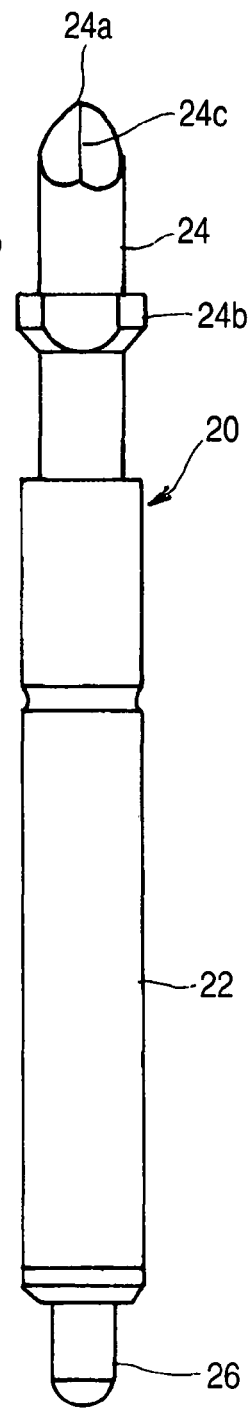

JIG FOR KELVIN TEST

BACKGROUND OF THE INVENTION

The present invention relates to a jig for Kelvin Test which is used in Kelvin Method, and adapted to be brought into elastic contact with a terminal provided on an electronic component to be tested thereby to test an electronic circuit or the like of the electronic component to be tested.

As one of methods for testing an electronic circuit or the like, there has been Kelvin Method. In performing this method, plungers 56, 56 of two probes 54, 54 are brought into elastic contact with a single terminal 52 which is provided on an electronic component 50 to be tested, as shown in FIG. 9. One of the probes 56 is used as a current supplying probe for supplying electric current to the terminal 52, having its other end contacted with an electric current supplying terminal 60. The other of the probes 56 is used as a voltage monitoring probe for monitoring electric voltage of the terminal 52, having its other end contacted with a voltage monitoring terminal 62. In the Kelvin Method, it is necessary to supply the electric current of a desired value to the terminal 52, and to keep the terminal 52 at a desired voltage.

Related arts to the probes 54, 54 which are favorably used in this Kelvin Method are disclosed in JP-A-2005-62100, JP-UM-A-03-122370, and JP-UM-A-61-48372. In any of the arts disclosed in these related arts, the two probes 54, 54 in pairs, namely, the current supplying probe and the voltage monitoring probe have the same size and shape.

In recent years, the terminal 52 which is provided on a circuit board on which the electronic circuit or the like is formed has become extremely small in shape. Moreover, in case where a plurality of the terminals 52, 52 are arranged, a pitch between the terminals has become extremely small. On the other hand, a large electric current must be supplied to the terminals 52, 52 . . . for test, in some cases. In case where the probes disclosed in the above described related arts are made compact in correspondence with the size of the terminals 52, 52 . . . which are provided on the electronic component 50 to be tested, when a large current is supplied for test, a large drop of electric voltage occurs in the current supplying probe 54, and a desired voltage cannot be maintained in the terminals 52, 52. This is because a sectional area of a tube of the probe 54 in a direction perpendicular to the axial direction is reduced in proportion to compactness of the probe, and its resistance value is increased, whereby a large drop of voltage occurs when a large current is supplied.

SUMMARY

It is therefore an object of the invention to provide a jig for Kelvin Test in which a sectional area of a tube of a current supplying probe is made larger than a sectional area of a tube of a voltage monitoring probe, so that a large drop of voltage may not occur even in case where a large current flows.

In order to achieve the object, according to the invention, there is provided a jig for Kelvin Test, comprising:

a pair of probes, including a first probe and a second probe which are arranged in parallel in a socket comprised of insulating material, each probe including:

an conductive tube;

an conductive plunger, contained in at least one end side of the tube, and having a distal end part protruding outward from the tube in an axial direction of the tube, the plunger adapted to be brought into elastic contact with a terminal of an electronic component to be tested, and a coil spring, contained in the tube, and adapted to elastically urge the plunger outward, wherein the first probe is used for supplying electric current to the terminal, the second probe is used for monitoring electric voltage of the terminal, and a first cross section of the tube of the first probe which is perpendicular to the axial direction is greater than a second cross section of the tube of the second probe which is perpendicular to the axial direction.

BRIEF DESCRIPTION OF THE DRAWINGS

FIG. 2A is a front view showing an outer appearance of a current supplying probe, FIG. 2B is a side view of the same, and FIG. 2C is a plan view of the same.

DETAIL DESCRIPTION OF PREFERRED EMBODIMENTS

Now, a first embodiment of the invention will be described referring to FIGS. 1 to 6.

Figure 1:
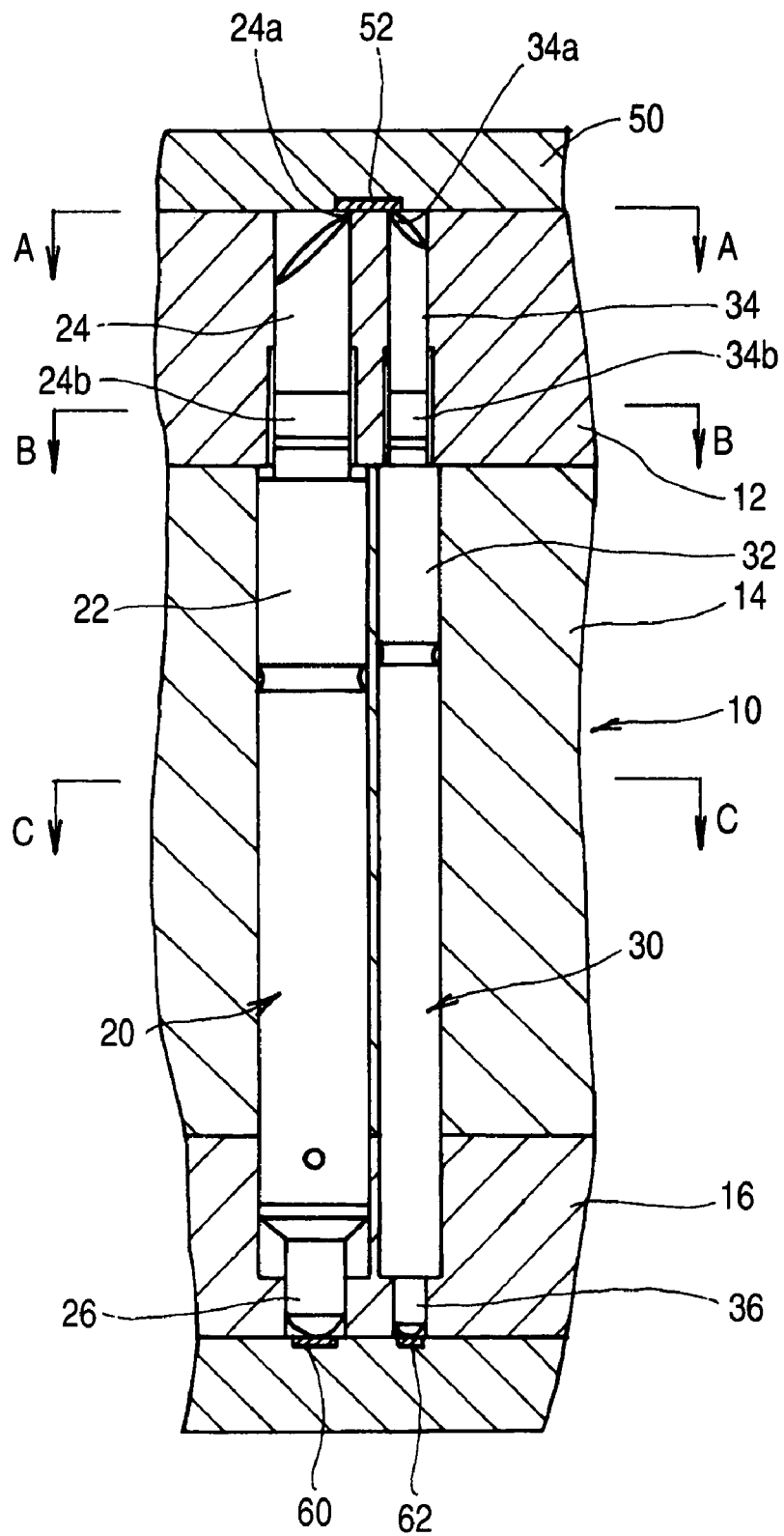
FIG. 1 is a view showing a jig for Kelvin Test in a first embodiment of the invention in which a socket is cut away in a vertical direction.
Figure 3C:
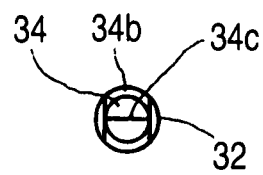
FIG. 3C is a plan view of the same.
Figure 3A:
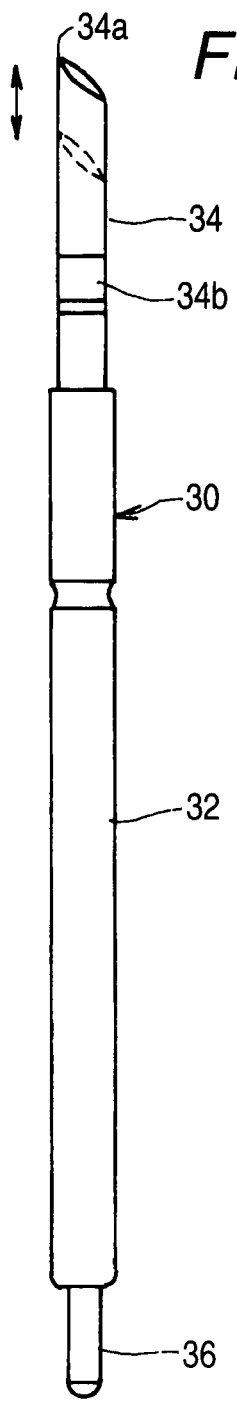
FIG. 3A is a front view showing an outer appearance of a voltage monitoring probe.
Figure 3B:
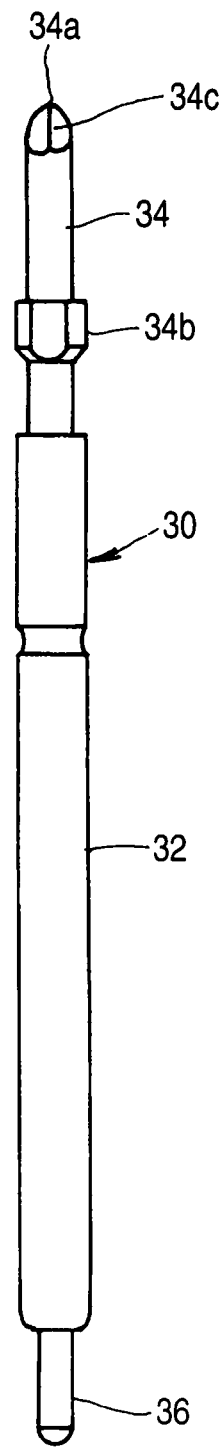
FIG. 3B is a side view of the same.

In FIG. 1, a current supplying probe 20 and a voltage monitoring probe 30 which are in pairs are arranged in parallel in a socket 10 formed of insulating material. As shown in FIGS. 2A to 2C, the current supplying probe 20 has a plunger 24 formed of electrically conductive metal which is provided at one end of a tube 22 formed of electrically conductive metal so as to be protruded and contracted, in such a manner that a distal end part of the plunger 24 may protrude outward and may not escape. A coil spring (not shown) for elastically urging the plunger 24 outward is contained in the tube 22 in a contracted state. A contact part 26 formed of electrically conductive metal and adapted to be brought into contact with a current supplying terminal 60 is provided at the other end of the tube 22 in a state electrically connected to the tube 22. The distal end part of the plunger 24 has such a shape that the distal end part is cut at two planes inclined in opposite directions to each other, one of which is diagonal with respect to the axial direction and the other of which is also diagonal in a direction different from the one plane thereby to form a ridgeline 24c at a middle of the two planes. Alternatively, the distal end part may have such a shape as cut at a flat plane diagonal with respect to the axial direction, or a spoon-cut shape having a diagonal obtuse curve. In either shape, the most distal end part of the plane which has been diagonally cut becomes a contact point 24a to be brought into elastic contact with a terminal 52 which is provided on an electronic component 50 to be tested. Further, the plunger 24 is provided with a swelled part 24b at a position protruded outward from the tube 22. This swelled part 24b has an oval shape in cross section in a direction perpendicular to the axial direction. In an example, the tube 22 has a round shape in cross section having an outer diameter of 0.58 mm, and an inner diameter of 0.43 mm. The plunger 24 has an outer diameter of 0.41 mm in cross section and a total length of 6mm in its unloaded state. As shown in FIGS. 3A to 3C, the voltage monitoring probe 30 has a plunger 34 formed of electrically conductive metal which is provided at one end of a tube 32 formed of electrically conductive metal so as to be protruded and contracted, in such a manner that a distal end part of the plunger 34 may protrude outward and may not escape. A coil spring (not shown) for elastically urging the plunger 34 outward is contained in the tube 32 in a contracted state. A contact part 36 formed of electrically conductive metal and adapted to be brought into contact with a voltage monitoring terminal 62 is provided at the other end of the tube 32 in a state electrically connected to the tube 32. The distal end part of the plunger 34 has such a shape that the distal end part is cut at two planes inclined in opposite directions to each other, one of which is diagonal with respect to the axial direction and the other of which is also diagonal in a direction different from the one plane thereby to form a ridgeline 34c at a middle of the two planes. Alternatively, the distal end part may have such a shape as cut at a flat plane diagonal with respect to the axial direction, or have a spoon-cut shape having a diagonal obtuse curve. In either shape, the most distal end part of the plane which has been diagonally cut becomes a contact point 34a to be brought into elastic contact with the terminal 52 which is provided on the electronic component 50 to be tested. Further, the plunger 34 is provided with a swelled part 34b at a position protruded outward from the tube 32. This swelled part 34b has an oval shape in cross section in a direction perpendicular to the axial direction. In an example, the tube 32 has a round shape in cross section having an outer diameter of 0.30 mm, and an inner diameter of 0.23 mm. The plunger 32 has an outer diameter of 0.21 mm in cross section and a total length of 6 mm in its unloaded state.

The socket 10 includes a retainer 12, a pin block 14, and a pin plate 16 which are stacked in three layers. The pin block 14 which is arranged at the middle of these three layers is formed with a through hole having a large diameter into which the tube 22 of the current supplying probe 20 is inserted and another through hole having a small diameter into which the tube 32 of the voltage monitoring probe 30 is inserted. The retainer 12 which is arranged at a distal end side of the three layers is provided with rotation detents 12a, 12b with which the swelled parts 24b, 34b are engaged to be inserted so that rotations of the plungers 24, 34 around the axes may be prevented, in a state where the diagonal faces at the distal end parts of the plungers 24, 34 are positioned back to back, and so that the tubes 22, 32 may not escape in a direction toward the distal end. The pin plate 16 which is positioned at a back end side of the three layers is formed with neck parts so that the contact parts 26, 36 at the other end may protrude outward, and so that the other ends of the tubes 22, 32 may not escape in direction toward the back end. Cross sectional shapes of the swelled parts 24b, 34b in a direction perpendicular to the axial direction are not limited to the oval shape but may be a square shape or a round shape partly cut away, provided that the swelled parts 24b, 34b can be engaged with the rotation detents 12a, 12b to restrict postures of the plungers 24, 34 around their axes.

Figure 4:
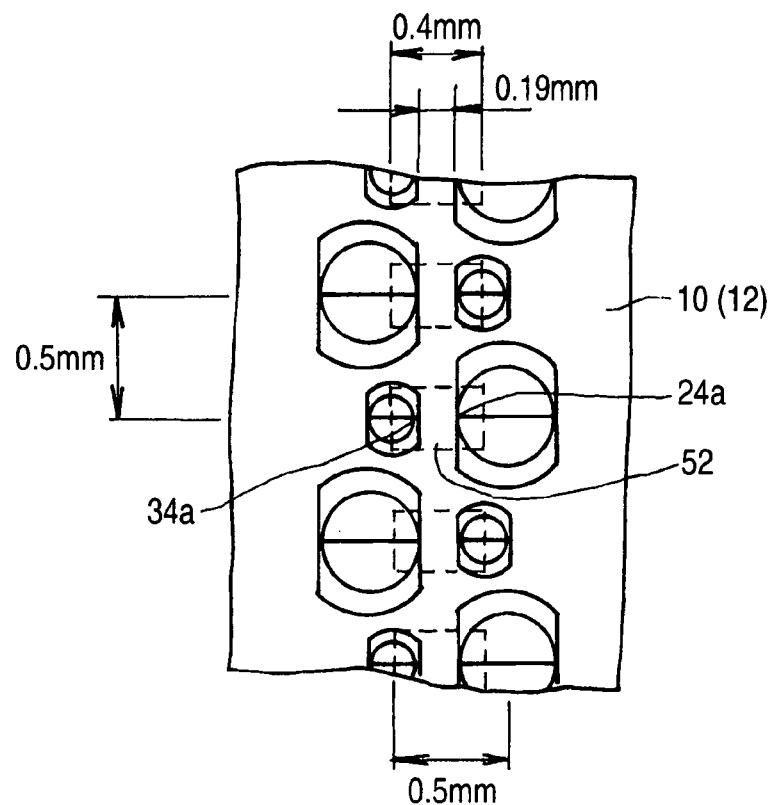
FIG. 4 is a sectional view as seen in a direction of arrow marks A-A in FIG. 1.
Figure 5:
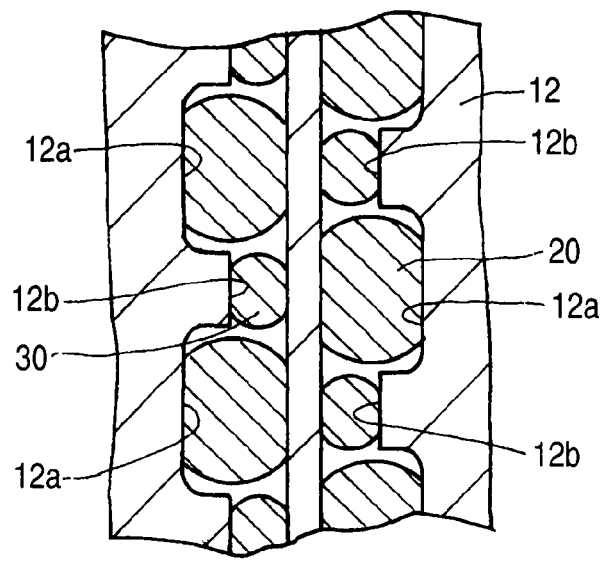
FIG. 5 is a sectional view as seen in a direction of arrow marks B-B in FIG. 1.
Figure 6:
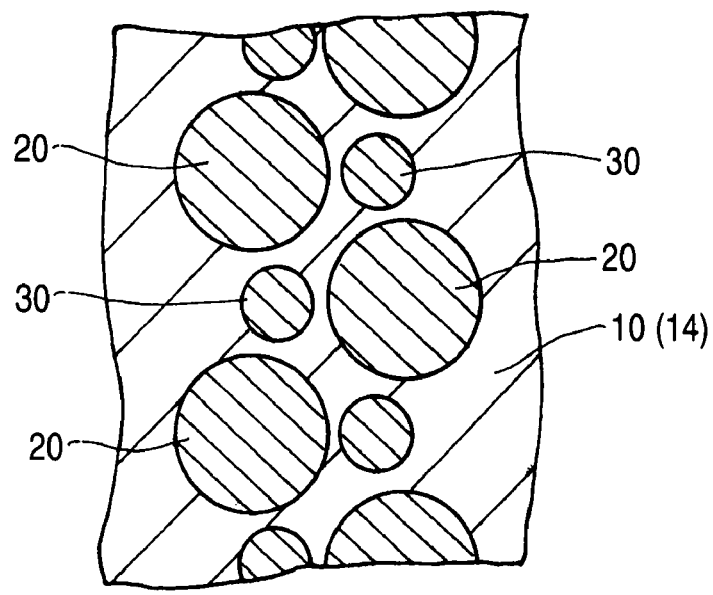
FIG. 6 is a sectional view as seen in a direction of arrow marks C-C in FIG. 1.

In case where a plurality of the current supplying probes 20 and the voltage monitoring probes 30 are arranged according to a pitch direction of a plurality of the terminals 52, 52 which are provided on the electronic component 50 to be tested, the current supplying probes 20 and the voltage monitoring probes 30 are arranged alternately with respect to the pitch direction, as shown in FIG. 4. As shown in FIG. 5, the rotation detents 12a, 12b formed in the retainer 12 are so arranged as to be alternately engaged with the swelled parts 24b of the current supplying probes 20 and the swelled parts 34b of the voltage monitoring probes 30 in the pitch direction. Although in the first embodiment, the rotation detents 12a, 12b are continuously formed in sequence, the invention is not limited to the case, but rotation retaining holes to be engaged with the swelled parts 24b, 34b may be formed. Further, in the pin block 14, the through holes having a large diameter into which the current supplying probes 20 can be inserted, and the through holes having a small diameter into which the voltage monitoring probes 30 can be inserted are alternately arranged with respect to the pitch direction.

In the above described structure, an outer shape of the tube 22 of the current supplying probe 20 is set to be large, and hence, the sectional area of the tube 22 in the direction perpendicular to the axial direction can be made large, whereby resistance value of the tube 22 in the axial direction becomes small correspondingly. Although electric current up to only 0.6A can flow in the related arts, it is possible to supply electric current up to 3.5A according to an experiment in this invention, because a large voltage drop will not occur even when a large current is supplied to the current supplying probe 20. Moreover, even though the current supplying probe 20 and the voltage monitoring probe 30 in pairs are provided at an interval of 0.5 mm, as shown in FIG. 4, the contact points 24a, 34a at the distal ends can be arranged at an interval of 0.19 mm, because the rotations around the axes are hindered in such arrangement that the diagonal faces at the distal end parts of the plungers 24, 34 are positioned back to back. Therefore, it is possible to bring the two contact points 24a, 34a into elastic contact with the terminal 52 which has a length of 0.4 mm with allowance. Further, it is possible to arrange a plurality of pairs of the current supplying probes 20 and the voltage monitoring probes 30 at a pitch of 0.5 mm, because the current supplying probes 20 and the voltage monitoring probes 30 are alternately arranged in the pitch direction in which a plurality of the terminals 52, 52 . . . are arranged.

Moreover, each of the distal end parts of the plungers 24, 34 has such a shape that the distal end part is cut at two planes inclined in opposite directions to each other, one of which is diagonal with respect to the axial direction and the other of which is also diagonal in a direction different from the one plane thereby to form a ridgeline 24c, 34c at a middle of the two planes. Therefore, the contact points 24a, 34a have a sharp shape, and contact resistance can be reduced due to thrusting effect. As the results, an amount of heat to be generated is reduced in proportion to the reduced contact resistance, and so, a large current can be supplied. Besides, cross sections of the contact points 24a, 34a in the direction perpendicular to the axial direction have a substantially sector shape having a large sectional area, and mechanical strength of the contact points is larger as compared with a contact point which has been obtained by cutting simply at a plane diagonal with respect to the axial direction, and a contact point in a spoon-cut shape having an obtuse diagonal curve.

Figure 7:
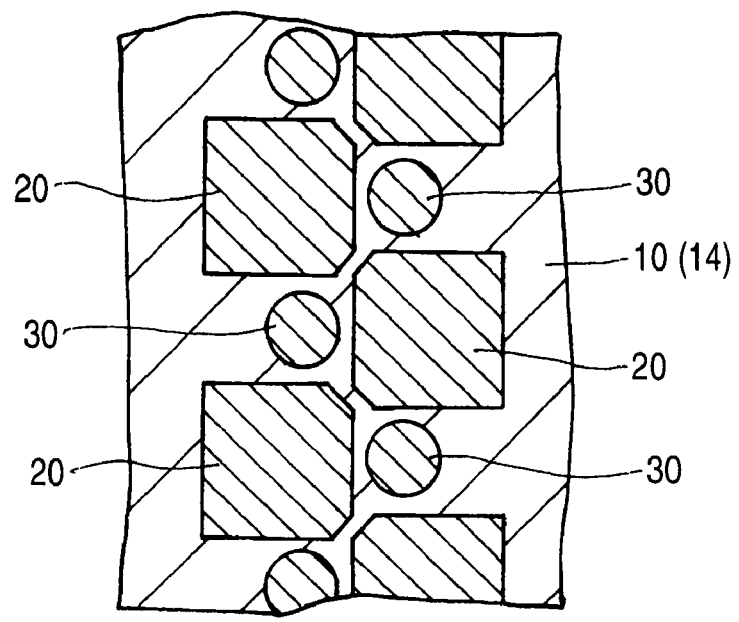
FIG. 7 is a view showing sectional shapes of tubes of a current supplying probe and a voltage monitoring probe of a jig for Kelvin Test in a second embodiment of the invention.

Then, a second embodiment of the invention will be described referring to FIG. 7. In FIG. 7, members which are equivalent to or the same as those members in FIGS. 1 to 6 will be denoted with the same reference numerals, and overlapped description will be omitted.

In the second embodiment of the invention, for the purpose of increasing the sectional area of the tube 22 of the current supplying probe 20 in the direction perpendicular to the axial direction, the outer shape of the tube 22 is enlarged within an allowable range, at an opposite side to the side where the voltage monitoring probe 30 is provided. In the second embodiment which is shown in FIG. 7, the outer shape of the tube 22 has a substantially square shape instead of a round shape. As much as the outer shape is enlarged in the four corners, the sectional area of the tube 22 is increased, and the resistance value is lowered, whereby it is possible to supply a large current.

Figure 8:
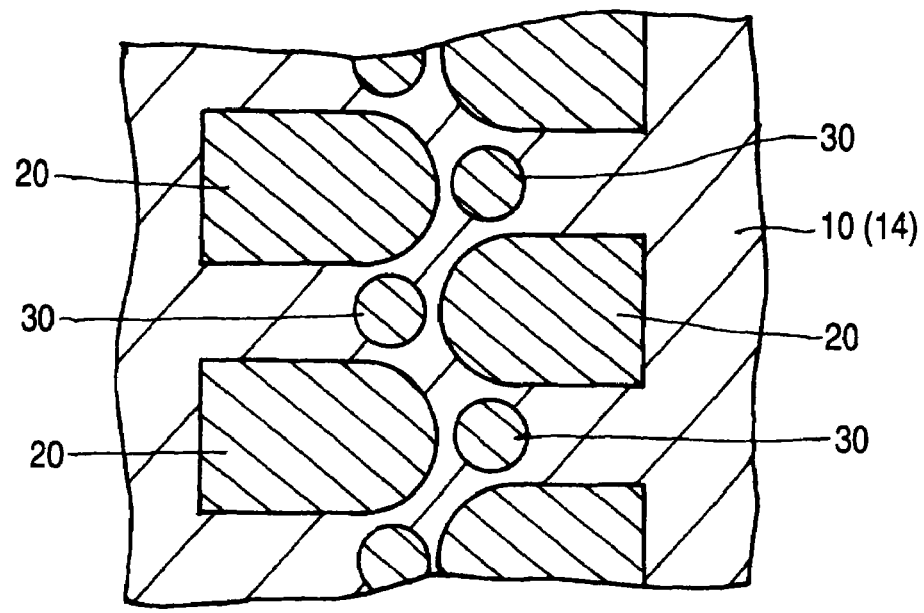
FIG. 8 is a view showing sectional shapes of tubes of a current supplying probe and a voltage monitoring probe of a jig for Kelvin Test in a third embodiment of the invention.
Figure 9:
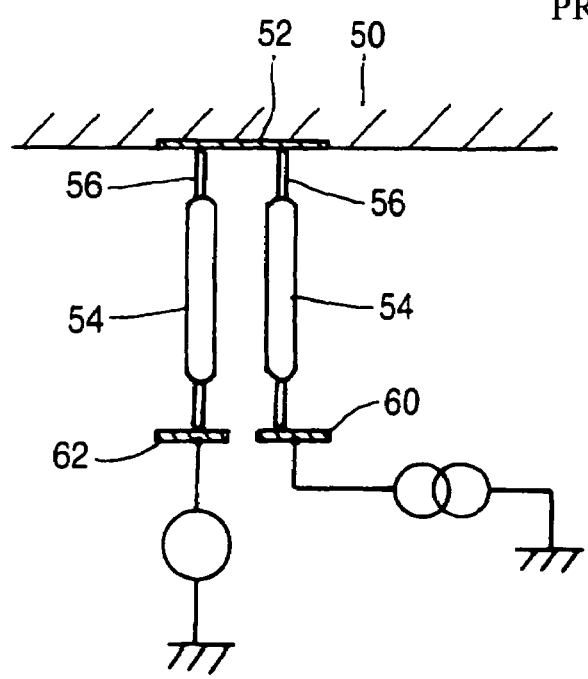
FIG. 9 is a view for briefly explaining a circuit structure of Kelvin Method.

Further, a third embodiment of the invention will be described referring to FIG. 8. In FIG. 8, members which are equivalent to or the same as those members in FIGS. 1 to 7 will be denoted with the same reference numerals, and overlapped description will be omitted.

In the third embodiment of the invention, for the purpose of increasing the sectional area of the tube 22 of the current supplying probe 20 in the direction perpendicular to the axial direction, the outer shape of the tube 22 is enlarged in the direction perpendicular to the pitch direction at an opposite side to the side where the voltage monitoring probe 30 is provided. In the third embodiment which is shown in FIG. 8, the outer shape of the tube 22 has a substantially rectangular shape. As much as the sectional area of the tube 22 is increased as the rectangular shape, the resistance value is lowered, whereby it is possible to supply a large current. Besides, since the size of the tube 22 in the pitch direction is not varied, it is possible to arrange the tubes at the same pitch as in the first embodiment.

Although the current supplying probe 20 and the voltage monitoring probe 30 are provided with the plungers 24, 34 as the movable terminals at their respective one ends in the above described embodiments, it is of course possible to provide the movable terminals at both opposite ends. Moreover, in the above described embodiments, those parts of the plungers 24, 34 protruded outward from the tubes 22, 32 are formed in a round shape, and provided with the swelled parts 24b, 34b. However, the invention is not limited to the case, but, entireties of the parts of the plungers 22, 32 protruded outward from the tubes 22, 32 maybe formed in the same sectional shape as the sectional shape of the swelled parts 24b, 34b. Further, the contact points 24a, 34a of the plungers 24, 34 are not limited to those which are obtained by cutting at the planes diagonal with respect to the axial direction as in the above described embodiments, but may be in any shape, provided that the distal end parts are appropriately sharpened.

In the jig for Kelvin Test according to the invention, the resistance value of the tube of the current supplying probe can be made small, because the sectional area of the tube of the current supplying probe in the direction perpendicular to the axial direction is set to be larger than the sectional area of the tube of the voltage monitoring probe in the direction perpendicular to the axial direction. As the results, a large drop of the electric voltage will not occur, even when a large current flows. Therefore, in this invention, it is possible to supply a larger current without a large voltage drop, as compared with the case where the current supplying probe and the voltage monitoring probe having the substantially same shape in the related arts are brought into elastic contact with the terminal which is provided on the electronic component to be tested.

In the jig for Kelvin Test according to the invention, the current supplying probes having the tubes of the large outer shape and the voltage monitoring probes having the tubes of the small outer shape are alternately arranged in the pitch direction of a plurality of the terminals which are provided on the electronic component to be tested. Therefore, it is possible to arrange the probes according to even a smaller pitch, as compared with the case where the current supplying probes having the tubes of the large outer shape are arranged at only one side.

In the jig for Kelvin Test according to the invention, each of the distal end parts of the plungers has such a shape that the distal end part is cut at two planes inclined in opposite directions to each other, one of which is diagonal with respect to the axial direction and the other of which is also diagonal in a direction different from the one plane thereby to form a ridgeline at a middle of the two planes therefore, the contact point has a sharp shape, and contact resistance can be reduced due to thrusting effect. Besides, a cross section of the contact point in the direction perpendicular to the axial direction has a substantially sector shape, and mechanical strength of the contact point is enhanced.

What is claimed is:

1. A jig for Kelvin Test, comprising: a pair of probes, including a first probe and a second probe which are arranged in parallel in a socket comprised of insulating material, each probe including: a conductive tube; a conductive plunger, contained in at least one end side of the tube, and having a distal end part protruding outward from the tube in an axial direction of the tube, the plunger being brought into elastic contact with a common terminal of an electronic component to be tested, and a coil spring, contained in the tube, and elastically urging the plunger outward, wherein the first probe supplies electric current to the terminal, the second probe monitors electric voltage of the terminal, and a first cross section of the tube of the first probe which is perpendicular to the axial direction is greater than a second cross section of the tube of the second probe which is perpendicular to the axial direction; wherein a plurality of the terminals are arranged in a first direction on the electronic component to be tested, a plurality of the pair of probes are arranged in the first direction in the socket, and the first probes and the second probes are arranged alternately in the first direction.

2. The jig according to claim 1, wherein the first cross section is greater than the second cross section in a direction different from a direction in which the first probe is opposed to the second probe, and the first cross section is greater than the second cross section in a direction perpendicular to the first direction.

3. The jig according to claim 1, wherein the distal end part of the plunger of the first probe has:
   a first inclined face, inclined with respect to the axial direction; and
   a first swelled part, having one of an oval shape, a square shape, and a round shape partly cut away in a cross section being perpendicular to the axial direction,
   the distal end part of the plunger of the second probe has:
   a second inclined face, inclined with respect to the axial direction, and a second swelled part, having one of an oval shape, a square shape, and a round shape partly cut away in a cross section being perpendicular to the axial direction, wherein
   the first inclined face and the second inclined face are directed to opposite directions to each other, and the first swelled part and the second swelled part are fitted to the socket, respectively.

4. The jig according to claim 3, wherein
each of the first inclined face and the second inclined face have a pair of inclined parts which are inclined in opposite directions to each other, and the pair of inclined parts form a ridgeline.

5. The jig according to claim 1, wherein the first cross section is greater than the second cross section in a direction different from a direction in which the first probe is opposed to the second probe.

* * * * *